United States Patent
Kunnen et al.

(10) Patent No.: US 9,548,753 B1
(45) Date of Patent: Jan. 17, 2017

(54) SYSTEM AND METHOD FOR LINEARITY CALIBRATION IN MIXED-SIGNAL DEVICES

(71) Applicant: FREESCALE SEMICONDUCTOR INC., Austin, TX (US)

(72) Inventors: George R. Kunnen, Chandler, AZ (US); Mark A. Lancaster, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/221,286

(22) Filed: Jul. 27, 2016

(51) Int. Cl.
*H03M 1/12* (2006.01)
*H03M 1/10* (2006.01)
*H03M 1/66* (2006.01)

(52) U.S. Cl.
CPC .............. *H03M 1/1009* (2013.01); *H03M 1/12* (2013.01); *H03M 1/66* (2013.01)

(58) Field of Classification Search
CPC ........ H03M 1/1009; H03M 1/66; H03M 1/12; H03M 1/1014; H03M 1/1023; H03M 1/1038
USPC .......................................... 341/118, 120, 155
See application file for complete search history.

(56) References Cited

U.S. PATENT DOCUMENTS

| | | | |
|---|---|---|---|
| 6,323,792 B1 * | 11/2001 | Regier | ................ H03M 1/0612 341/118 |
| 7,379,831 B1 | 5/2008 | Tsyrganovich | |
| 7,825,837 B1 * | 11/2010 | Khasnis | ............. H03M 1/1014 341/118 |
| 8,542,138 B2 | 9/2013 | Galton et al. | |
| 9,219,493 B1 | 12/2015 | Kunnen et al. | |
| 2013/0106631 A1 | 5/2013 | Petigny et al. | |

FOREIGN PATENT DOCUMENTS

WO   2011051763 A1   5/2011

OTHER PUBLICATIONS

Taylor, G.; Galton, I., "A Mostly-Digital Variable-Rate Continuous-Time Delta-Sigma Modulator ADC," Solid-State Circuits, IEEE Journal of , vol. 45, No. 12, pp. 2634,2646, Dec. 2010.
Taylor, G.; Galton, I., "A reconfigurable mostly-digital ΔΣ ADC with a worst-case FOM of 160dB," VLSI Circuits (VLSIC), 2012 Symposium on , vol., No., pp. 166,167, Jun. 13-15, 2012.

(Continued)

*Primary Examiner* — Khai M Nguyen

(57) ABSTRACT

The embodiments described herein provide calibration systems and methods for mixed-signal devices. Specifically, the embodiments provide systems and methods for calibrating mixed-signal devices that can facilitate effective calibration of such mixed-signal devices, including mixed-signal devices with poorly characterized nonlinearities that cannot be effectively calibrated with traditional calibration techniques. In general, the embodiments described herein calibrate by measuring output values from a mixed-signal device with a known calibration input values being applied. The measured output values are used to determine localized polynomial interpolants. Each of the determined localized polynomial interpolants is then evaluated at an uncorrected output value, and the evaluated localized polynomial interpolants are then used to generate correction values.

19 Claims, 9 Drawing Sheets

(56) References Cited

OTHER PUBLICATIONS

Gong Yuehong; Luo Min; Yu Mingyan; Ma Jianguo; Mao Ze, "A novel approach to calibrate open-loop amplifier nonlinearities through piecewise linear interpolation," Solid-State and Integrated Circuit Technology (ICSICT), 2012 IEEE 11th International Conference on , vol., No., pp. 1,3, Oct. 29, 2012-Nov. 1, 2012.

Jie Yuan; Farhat, N.H.; Van der Spiegel, J., "Background Calibration With Piecewise Linearized Error Model for CMOS Pipeline A/D Converter," Circuits and Systems I: Regular Papers, IEEE Transactions on , vol. 55, No. 1, pp. 311,321, Feb. 2008.

Jie Yuan; Sheung Wai Fung; Kai Yin Chan; Ruoyu Xu, "A 12-bit 20 MS/s 56.3 mW Pipelined ADC With Interpolation-Based Nonlinear Calibration," Circuits and Systems I: Regular Papers, IEEE Transactions on , vol. 59, No. 3, pp. 555,565, Mar. 2012.

Kunnen, George R., U.S. Appl. No. 15/221,317 entitled "Analog-To-Digital Conversion With Linearity Calibration," filed Jul. 27, 2016.

\* cited by examiner $L_A(Y(i)) = (Y(i) - Y_D)*(Y(i) - Y_B)*(Y(i) - Y_C)/((Y_A - Y_D)*(Y_A - Y_B)*(Y_A - Y_C))$ $L_B(Y(i)) = (Y(i) - Y_A)*(Y(i) - Y_D)*(Y(i) - Y_C)/((Y_B - Y_A)*(Y_B - Y_D)*(Y_B - Y_C))$ $L_C(Y(i)) = (Y(i) - Y_A)*(Y(i) - Y_B)*(Y(i) - Y_D)/((Y_C - Y_A)*(Y_C - Y_B)*(Y_C - Y_D))$ $L_D(Y(i)) = (Y(i) - Y_A)*(Y(i) - Y_B)*(Y(i) - Y_C)/((Y_D - Y_A)*(Y_D - Y_B)*(Y_D - Y_C))$

BASIS FUNCTIONS

LOCALIZED POLYNOMIAL INTERPOLANT

| UNCORRECTED OUTPUT VALUE Y(i) | CORRECTED OUTPUT VALUE Z(i) |
|---|---|
| 3.0 | 3.015 |
| 2.5 | 2.502 |
| 2.0 | 1.995 |
| 1.5 | 1.432 |
| 1.0 | 0.971 |
| 0.5 | 0.487 |
| 0.0 | 0.0 |
| -0.5 | -0.413 |
| -1.5 | -0.961 |
| -1.0 | -1.458 |
| -2.0 | -1.879 |
| -2.5 | -2.468 |
| -3.0 | -2.854 |

SYSTEM AND METHOD FOR LINEARITY CALIBRATION IN MIXED-SIGNAL DEVICES

TECHNICAL FIELD

Embodiments relate generally to device calibration, and more particularly, embodiments of the subject matter relate to device calibration in mixed-signal devices. More specifically, the embodiments relate to correction of nonlinearity errors in mixed-signal devices.

BACKGROUND

In general, mixed-signal devices are devices that have both analog and digital components. For example, a mixed-signal device can include both analog and digital circuits integrated into a single semiconductor die. Examples of mixed-signal devices include analog-to-digital converters (ADCs) and digital-to-analog converters (DACs).

One continuing issue in mixed-signal devices is the need for calibration. In mixed-signal devices, calibration can be used to measure and adjust the relationship between analog and digital signals, and thus calibration can be used to improve the accuracy of mixed-signal devices. Unfortunately, current techniques for calibration in mixed-signal devices lack sufficient accuracy for many demanding applications. For example, in mixed-signal devices with high levels of non-linearity, the accuracy of calibration using standard techniques can be insufficient. This can be particularly true for mixed-signal devices where the nonlinearity is poorly characterized, as current techniques for calibration of poorly characterized nonlinearities are particularly problematic. Thus, what are needed are improved devices and techniques for the calibration of mixed-signal devices.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 6 shows four exemplary basis functions in accordance with an embodiment;

FIG. 7 shows a localized polynomial interpolant in accordance with an embodiment;

FIG. 9 shows a graphical representation of a correction table in accordance with an embodiment.

DETAILED DESCRIPTION

The embodiments described herein provide a calibration system for mixed-signal devices that can provide improved performance. Specifically, the embodiments provide systems and methods for calibrating mixed-signal devices that can facilitate effective calibration of such mixed-signal devices, including mixed-signal devices with poorly characterized nonlinearities that cannot be effectively calibrated with traditional calibration techniques.

In general, the embodiments described herein calibrate by measuring output values from a mixed-signal device with known calibration input values being applied. The measured output values are used to determine localized polynomial interpolants. Each of the determined localized polynomial interpolants is then evaluated at an uncorrected output value, and the evaluated localized polynomial interpolants are then used to generate correction values. These correction values can then be used to calibrate the mixed-signal device during later operation. As will be described in greater detail below, such a calibration technique can provide effective calibration for a variety of mixed-signal devices, including mixed-signal devices such as analog-to-digital converters (ADC's) and digital-to-analog converters (DACs), as well as the variety of devices that use ADCs and DACs.

In these embodiments, each of these localized polynomial interpolants is a unique function that represents a corrected output of the mixed-signal device as a function of the uncorrected output. Such a localized polynomial interpolant can represent a corrected output as a unique function when the uncorrected output values used to generate the interpolant are spaced sufficiently close together. Furthermore, because the localized polynomial interpolants represent the corrected output as a function of the uncorrected output, these interpolants can be used by being evaluated, rather than solved. As will be described below, evaluating such an interpolant can require significantly less computing resources than solving an equivalent interpolant. Thus, the use of such localized polynomial interpolants can significantly reduce resources needed to accurately calibrate a variety of mixed-signal devices.

Figure 1:
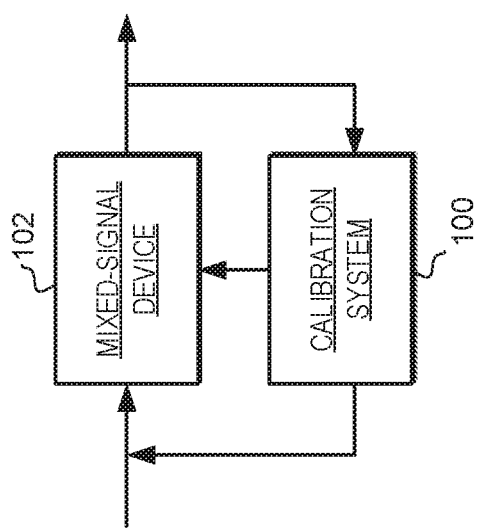
FIG. 1 shows a generalized block diagram of a calibration system for calibrating a mixed-signal device in accordance with an embodiment.

Turning now to FIG. 1, a schematic diagram of an exemplary calibration system 100 coupled to a mixed-signal device 102 is illustrated. In general, the calibration system 100 is configured to calibrate the mixed-signal device 102 to provide for accurate operation of the mixed-signal device 102. Such a calibration can compensate for non-linarites that would otherwise affect the outputs of the mixed-signal device 102.

To facilitate calibration, the calibration system 100 is configured to apply a set of known input values to an input of the mixed-signal device 102 and measure a corresponding set of output values generated by the mixed-signal device 102. The calibration system 100 is further configured to group the measured output values into a plurality of localized sets and determine a localized polynomial interpolant for each of these localized sets of output values. With the localized polynomial interpolant determined, the calibration system 100 is further configured to evaluate each localized polynomial interpolant at an uncorrected output value, and to generate a corrected output value from each of the evaluated localized polynomial interpolants. The calibration system 100 can then utilize the corrected output values to adjust the generated output of the mixed-signal device 102 during operation and thus can calibrate the mixed-signal device 102.

As will be described in greater detail below, such a calibration system 100 can facilitate effective calibration of a mixed-signal device 102 with poorly characterized non-linearities that cannot be effectively calibrated with some traditional calibration techniques.

In one embodiment, the calibration system 100 is configured to determine the localized polynomial interpolants by calculating a basis function for each of the plurality of localized sets. For example, a Lagrange basis function can be calculated for each of the localized sets, and then each Lagrange basis function can be used to determine a corresponding localized polynomial interpolant. A detailed example an embodiment will be described below.

Figure 2:
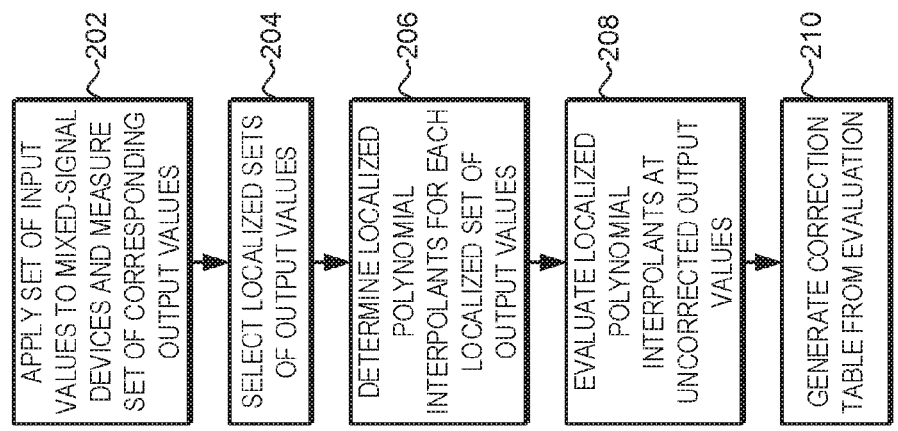
FIG. 2 shows a method of calibration in accordance with an embodiment.

Turning now to FIG. 2, a flow diagram of a method 200 is illustrated. The method 200 is an example of the type of process that can be used by a calibration system (e.g., calibration system 100) to calibrate mixed-signal devices (e.g., mixed-signal device 102).

The first step 202 of method 200 is to apply a set of input values to the mixed-signal device and measure a set of corresponding output values. It should be noted that in this step any suitable number of input values can be used. Additionally, the input values can be selected to have any suitable spacing between input values. In general, applying more input values with closer spacing between input values results in a greater number of output values, and using the greater number of output values can result in greater accuracy of the calibration. However, using a greater number of input and output values also requires greater processing resources to perform the calibration. Thus, it is generally desirable to use sufficient input values to provide the desired accuracy in calibration, without using excessive input and output values that could unacceptably degrade calibration performance.

In a typical embodiment, the set of input values applied to the mixed-signal device would have equal or substantially equal spacing between input values. As will be made clear below, providing such equal spacing between input values facilitates the determination of localized polynomial interpolants from the corresponding output values, and further facilitates evaluation of such interpolants for calibration.

Figure 3:
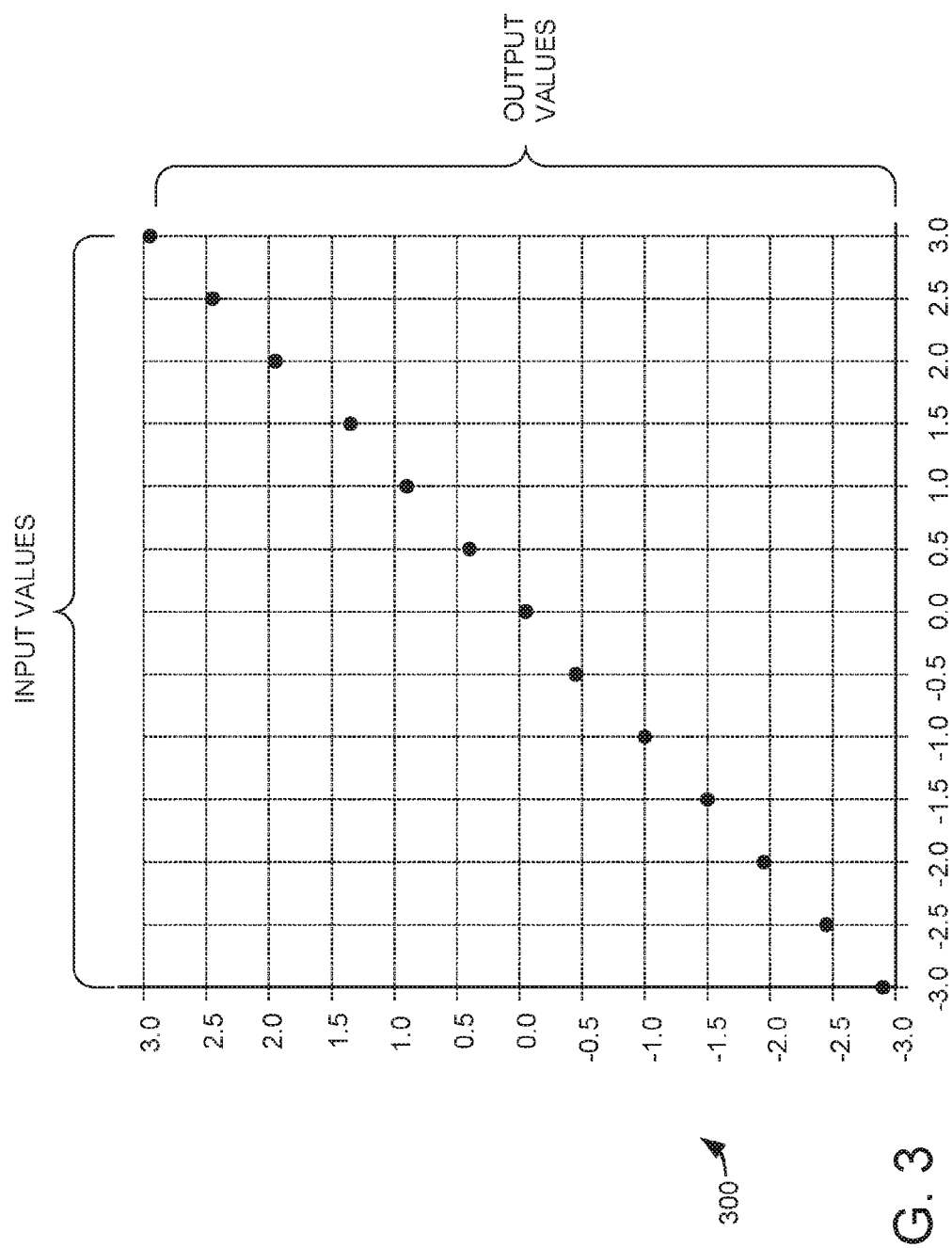
FIG. 3 shows a graphical representation of input values and output values in accordance with an embodiment.

Turning now to FIG. 3, a graphical representation 300 of a set of input values and a corresponding set of generated output values is illustrated. Again, these input values are exemplary of the type of input values that can be inputted to a mixed-signal device during calibration, and are further exemplary of the corresponding output values that can be generated by the mixed-signal device in response to these input values. For example, the illustrated set of input values are exemplary of the type of input values that can be applied to the analog input of an ADC, while the illustrated set of output values are exemplary of the digital output values that can be generated by the ADC in response to the these input values.

In the example of FIG. 3, thirteen input values are applied to the input of the mixed-signal device, and a corresponding thirteen output values are generated. However, this is just one example, and in other embodiments more or less input and output values can be used. Again, providing more input values and measuring more corresponding output values across the operation range of the mixed-signal device generally increases the accuracy of the calibration, at the expense of also increasing the resources needed to perform the calibration. It should be further noted that input values illustrated in this example have equal spacing between values (i.e., are equidistant) but due to the non-linearity of the mixed signal devices, the corresponding output values have non-equal spacing.

Finally, it should be noted that in this example the input values and output values express a direct, a monotonically increasing relationship. For example, an input value of −3.0 results in a corresponding output value of approximately −2.8. Again, this is just one example, and in other examples, for instance, an inverse, monotonically decreasing relationship can exist between the input values and the output values. For example, in a mixed-signal device with an inverse relationship an input value of −3.0 would result in a corresponding output value of approximately +3.0.

Returning to FIG. 2, the next step 204 in method 200 is to select localized sets of the output values. In general, each localized set of output values includes two or more adjacent output values that will be used together to generate a localized polynomial interpolant. In a typical embodiment each localized set of output values can include three or four adjacent output values, and with those three or four output values used together to generate a corresponding localized polynomial interpolant. Furthermore, to improve accuracy of the calibration it is generally desirable to select the localized sets of output values such that each partially overlaps with adjacent sets. This overlapping results in a greater number of localized sets, which can improve the accuracy of the calibration.

Figure 4:
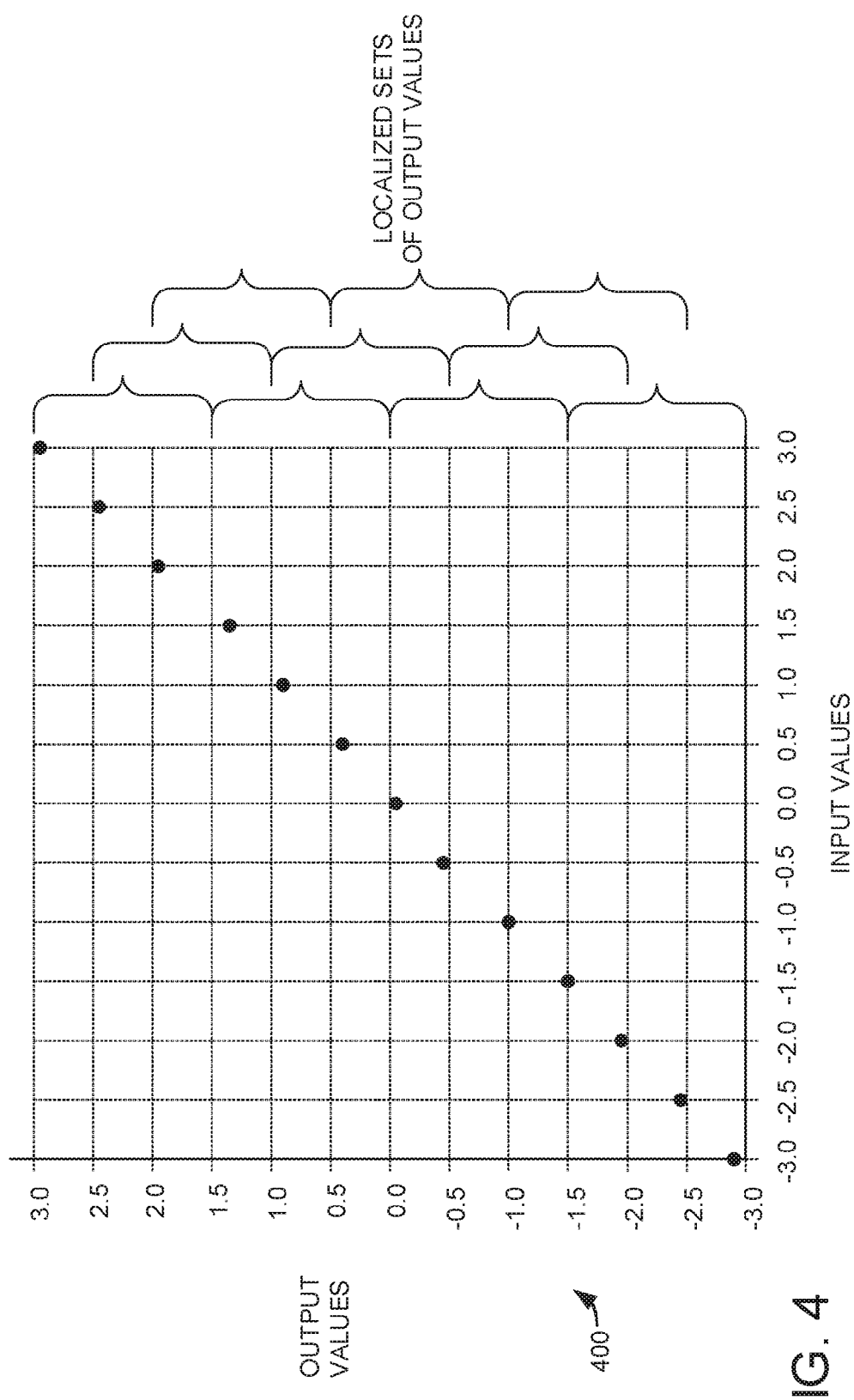
FIG. 4 shows a graphical representation of input values and output values, with the output values in defined localized sets in accordance with an embodiment.

Turning now to FIG. 4, a graphical representation 400 of the set of input values and corresponding set of generated output values is again illustrated. Furthermore, in FIG. 4 the output values are shown as being each assigned to one or more of a plurality of localized sets of output values, as indicated on the side of FIG. 4. Specifically, in the example of FIG. 4 thirteen output values are assigned to ten localized sets of output values, where each of the localized sets of output values includes four adjacent output values. Furthermore, in this example, each of the localized sets of output values partially overlaps with nearby localized sets of output values. Stated another way, the localized sets of output values intersect with at least one adjacent localized set of output values.

Again, it should be noted this is just one example of how such localized sets of output values can be configured. For example, in other embodiments such localized sets can include more or less output values in each set. Furthermore, in other embodiments the localized sets could be non-overlapping sets such that each output value is only a member of one localized set.

Returning to FIG. 2, the next step 206 in method 200 is to determine a localized polynomial interpolant for each of the localized sets of output values. In general, each of these localized polynomial interpolants is a unique function that represents a corrected output of the mixed-signal device as function of the uncorrected output of the mixed-signal device. As one example, each of these localized polynomial interpolants is an $N^{th}$ degree polynomial, where N+1 is the number of output values in the corresponding localized set of output values. As will be described below, because the localized polynomial interpolants represent the corrected output as function of the uncorrected output, they can be used to compensate for the non-linearity of the mixed-signal device. Furthermore, because the localized polynomial interpolants represent the corrected output as a function of the uncorrected output, these interpolants can be used by being evaluated, rather than solved. Evaluating such an interpolant requires significantly less computing resources than would be required to solve an interpolant where instead the uncorrected output is a function of the corrected output. Thus, the use of such localized polynomial interpolants can significantly reduce resources needed to accurately calibrate a variety of mixed-signal devices.

In general, the localized polynomial interpolants are generated using the output values in the corresponding localized set of output values. For example, an $N^{th}$ order polynomial can be fitted to N+1 output values in the localized set. Thus, in an embodiment where each localized set of output values includes four output values, the localized polynomial interpolant can comprise a cubic function (N=3) that is fitted to those four output values. Likewise, in an embodiment where each localized set of output values includes three output values, the localized polynomial interpolant can comprise a quadratic function (N=2) that is fitted to those three output values. Of course, these are just two examples, and higher order equations can be used with localized sets that include greater numbers of output values.

In one embodiment, the localized polynomial interpolants are each determined using a corresponding set of basis functions. In one more specific embodiment, each basis function can be directly calculated from a set of distinct points. In general, a basis function is an elementary continuous function which can be combined with other basis functions to form another continuous function. In this embodiment, basis functions are linearly combined to form the localized polynomial interpolants, where the localized polynomial interpolants are continuous functions that provide an interpolating function.

In one more specific embodiment, the localized polynomial interpolants are Lagrange polynomials, where a Lagrange polynomial is defined as the unique polynomial of the least degree that intersects a set of distinct points. In these embodiments the localized polynomial interpolants are each determined by linearly combining a set of Lagrange basis functions. Specifically, Lagrange basis functions can be directly calculated from a distinct set of output values and then linearly combined to generate a Lagrange polynomial which functions as a localized polynomial interpolant.

Figure 5:
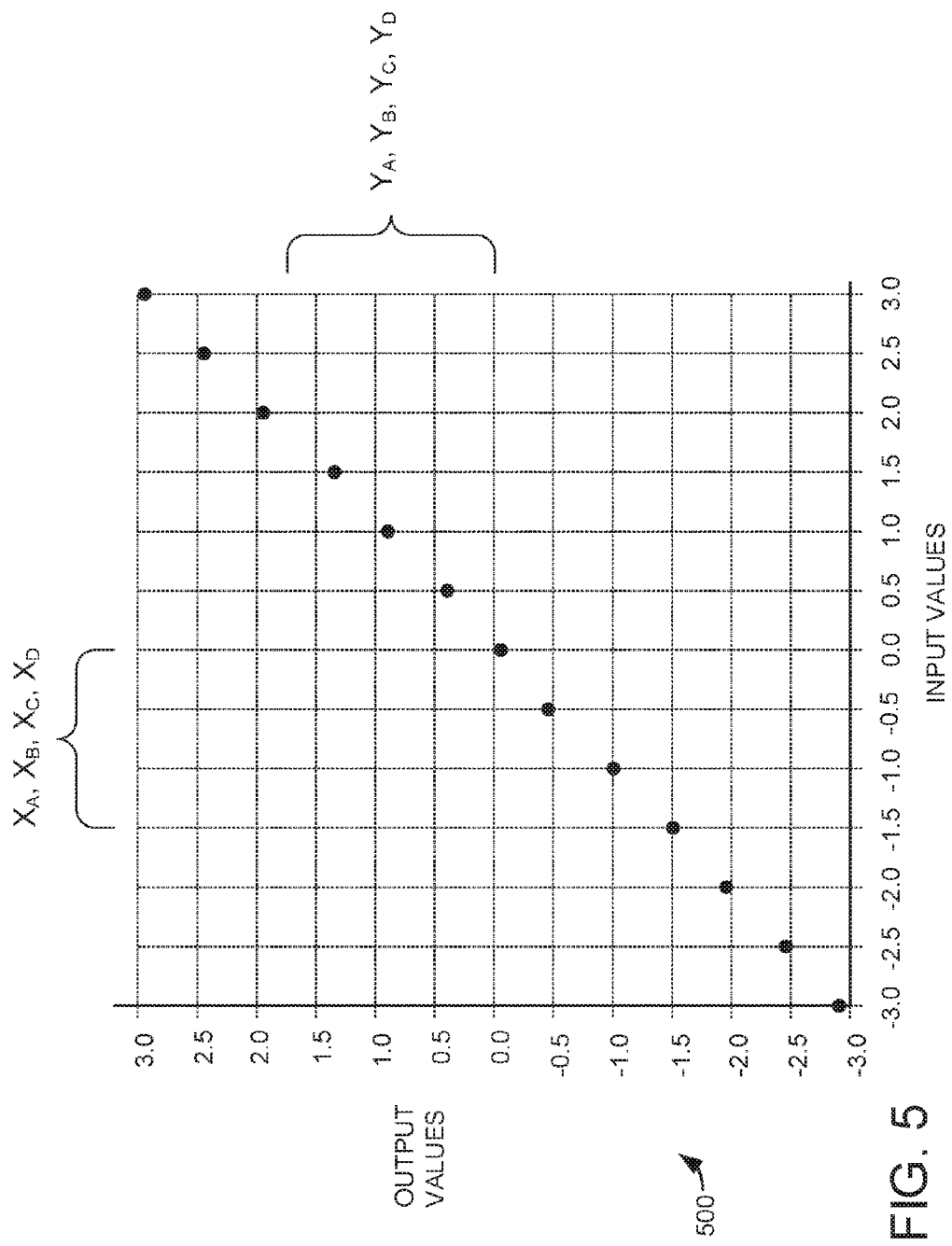
FIG. 5 shows a graphical representation of one localized set of output values and corresponding input values in accordance with an embodiment.

Turning now to FIG. 5, a graphical representation 500 of one localized set of input values ($X_A$, $X_B$, $X_C$, and $X_D$) and a corresponding localized set of output values ($Y_A$, $Y_B$, $Y_C$, and $Y_D$) is illustrated. Again, in this embodiment the localized set of output values comprises four adjacent output values, but in other implementations more or less output values could be included in each localized set. It should be noted that the localized set of input values ($X_A$, $X_B$, $X_C$, and $X_D$) and the corresponding localized set of output values ($Y_A$, $Y_B$, $Y_C$, and $Y_D$) are representative of any set of input values and corresponding output values, and as such will be used herein to define an example localized polynomial interpolant that is generated from the localized set of output values.

Turning now to FIG. 6, four exemplary basis functions 600 are illustrated. These basis functions are exemplary of the type of basis function that can be used to define localized polynomial interpolants. The four basis functions (indicated as $L_A(Y(i))$, $L_B(Y(i))$, $L_C(Y(i))$, and $L_D(Y(i))$) are defined in terms of four localized output values $Y_A$, $Y_B$, $Y_C$, and $Y_D$ and as a function of an uncorrected output value of interest $Y(i)$. The four basis functions 600 are an example of Lagrange basis functions that are particularly applicable to the embodiments described herein. Specifically, these Lagrange basis functions can be combined to generate a localized Lagrange polynomial that will provide a localized polynomial interpolant. When the output values $Y_A$, $Y_B$, $Y_C$, and $Y_D$ used to define the four basis functions are sufficiently closely spaced along the nonlinearity in question, such a Lagrange polynomial interpolant will closely match the nonlinearity over the range corresponding to those output values. Thus, the Lagrange polynomial interpolant represents the corrected output of the mixed-signal device as function of the uncorrected output.

Turning now to FIG. 7, an exemplary localized polynomial interpolant 700 is illustrated. First, the localized polynomial interpolant 700 is defined in terms of the four basis functions $L_A$, $L_B$, $L_C$, and $L_D$ and four input values $X_A$, $X_B$, $X_C$, and $X_D$. Second, the localized polynomial interpolant 700 is illustrated as an equivalent cubic polynomial function in terms of the uncorrected output value $Y(i)$. Again, in this illustrated example, the basis functions can be Lagrange basis functions and thus the localized polynomial interpolant 700 can be a Lagrange polynomial.

The exemplary localized polynomial interpolant 700 defines a corrected output value $Z(i)$ in terms of the uncorrected output value $Y(i)$. This interpolant 700 can be used to generate corrected output values for calibration by being evaluated, rather than solved. Specifically, the interpolant 700 can be evaluated by simply inserting the uncorrected output value $Y(i)$ into the interpolant 700 and calculating the result $Z(i)$. Thus, evaluating the localized polynomial interpolant rather than solving can be efficiently executed in hardware and will typically require significantly less computing resources, and thus can provide for faster and more efficient calibration. Again, the accuracy of this technique is dependent on the condition that the set of output values used to generate the basis functions lie sufficiently closely to one another, such that the localized polynomial interpolant 700 can sufficiently match the nonlinearity over the range of output values spanned by the set of output values.

Returning to FIG. 2, it should be noted that the step 206 in method 200 would be performed for each of the localized sets of output values. Thus, for the example of FIG. 4, the ten overlapping localized sets of output values would be used to determine ten localized polynomial interpolants 700. And as such, each of these localized polynomial interpolants applies to a piecewise portion of the range of output values. And again, it should be noted that because localized sets of output values overlap, the localized polynomial interpolants functionally overlap as well.

The next step 208 in method 200 is to evaluate the localized polynomial interpolants at uncorrected output values. Specifically, with the localized polynomial interpolants generated for each localized set of output values, these interpolants can then be used to generate a corresponding set of corrected output values. It should be noted that in performing step 208 for an uncorrected output value, that the localized polynomial interpolant most closely centered on the uncorrected output should be used. As was noted above, in some embodiments the localized sets of output values partially overlap, and in those cases the localized polynomial interpolants also would partially overlap. Thus, in these cases it is generally desirable to use the localized polynomial interpolant that is most closely centered on the uncorrected output value.

And again these localized polynomial interpolants can evaluated, rather than solved. Thus, step 208 can be performed by simply inserting uncorrected output values $Y(i)$ into the localized polynomial interpolant and evaluating the interpolant to calculate the corrected output value $Z(i)$.

Figure 8:
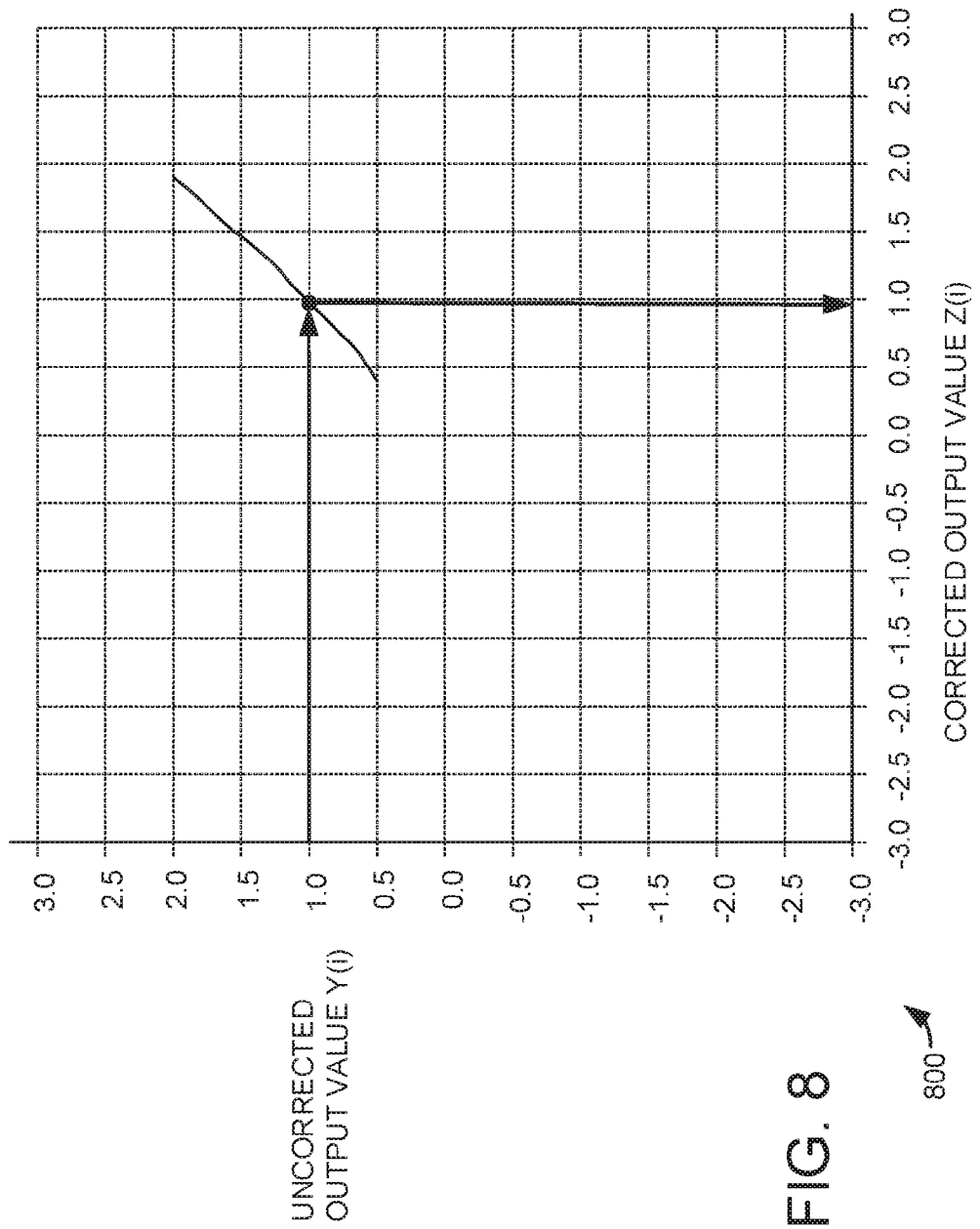
FIG. 8 shows a graphical representation of an uncorrected output value and a corresponding corrected output value in accordance with an embodiment.

Turning now to FIG. 8, a graphical representation 800 of an uncorrected output value $Y(i)$ and corresponding corrected output value $Z(i)$ is illustrated. Specifically, the graphical representation 800 shows an example result of a localized polynomial interpolant being evaluated with an uncorrected output value Y(i) as the input variable to generate a corrected output value Z(i).

The next step 210 in method 200 is to generate a correction table for the evaluation. In general, this step performs the evaluation of step 208 for a selected group of uncorrected output values and generates a corresponding set of corrected output values. These uncorrected output values and corrected output values can be used to populate a correction table, and that correction table can then be used for future operation of the mixed-signal device. Turning to FIG. 9, a graphical representation of exemplary correction table 900 is illustrated. The correction table 900 includes a set of uncorrected output values Y(i) and a corresponding set of corrected output values Z(i).

Again, such a correction table 900 can be used during operation of the mixed-signal device to provide calibration of the mixed-signal device. Specifically, the corrected output values can be substituted for the output of the mixed-signal device to provide calibration correction.

Thus, once the correction table 900 has been generated, those corrected solutions can be used for later uncorrected output values being outputted by the mixed-signal device. As one detailed example, the correction table 900 can be implemented as a look up table (LUT), where the uncorrected output values serve as addresses to select more accurate corrected output values which are then substituted for the uncorrected output values. For example, the uncorrected output values can be implemented as a 5-bit LUT addresses that selects one of 32 registers, where each register contains a more accurate corrected output value that will serve as the actual mixed-signal device output.

It should be noted that in a typical application, that steps 202-210 could be performed relatively infrequently. Thus, once the correction table is generated it can be used for some significant length of time to provide calibration to the mixed-signal device. However, because the method 200 evaluates localized polynomial interpolants rather than solving them, the processing required to perform steps 202-210 can be significantly reduced. Thus, in some embodiments these calibration steps can be performed more frequently than traditional techniques. Likewise, in some embodiments these calibration steps can be performed with less computing resources than were required with some traditional techniques.

As was described above, the various calibration techniques and devices described herein can be applied to a wide variety of mixed-signal devices, including analog-to-digital converters (ADC's) and digital-to-analog converters (DACs). Furthermore, these calibration techniques can be implemented with a variety of devices. For example, these calibration techniques can be performed with a variety of processing devices, sometimes referred to as processors, processing units, or microprocessors. Such processing devices can be implemented as an integrated circuit with the mixed-signal device to be calibrated, or separate from the mixed-signal device.

As some specific examples, the calibration techniques can be implemented with specialized processing hardware designed to implement the steps described above. In other examples, the techniques described above can be implemented as software implemented programs, and then executed with a processing device that utilizes integrated circuits designed to execute programs stored in a memory. Some processing devices include application-specific integrated circuits (ASICs) designed for particular use cases, or general purpose central processing units (CPUs) that commonly provide the central processing functionality of typical computers. System on Chip (SoC) processors can integrate a wide variety of components of a system into a single chip. Such devices may include digital, analog, mixed-signal and other functions on a single chip substrate. As such, SoC processors can be used to implement with the calibration techniques on a single chip with one or more mixed-signal device.

It should be noted conventional techniques related to processor design may not be described in detail herein. It should be understood that devices described herein may be implemented either in silicon or another semiconductor material or alternatively by software code representation thereof.

Figure 10:
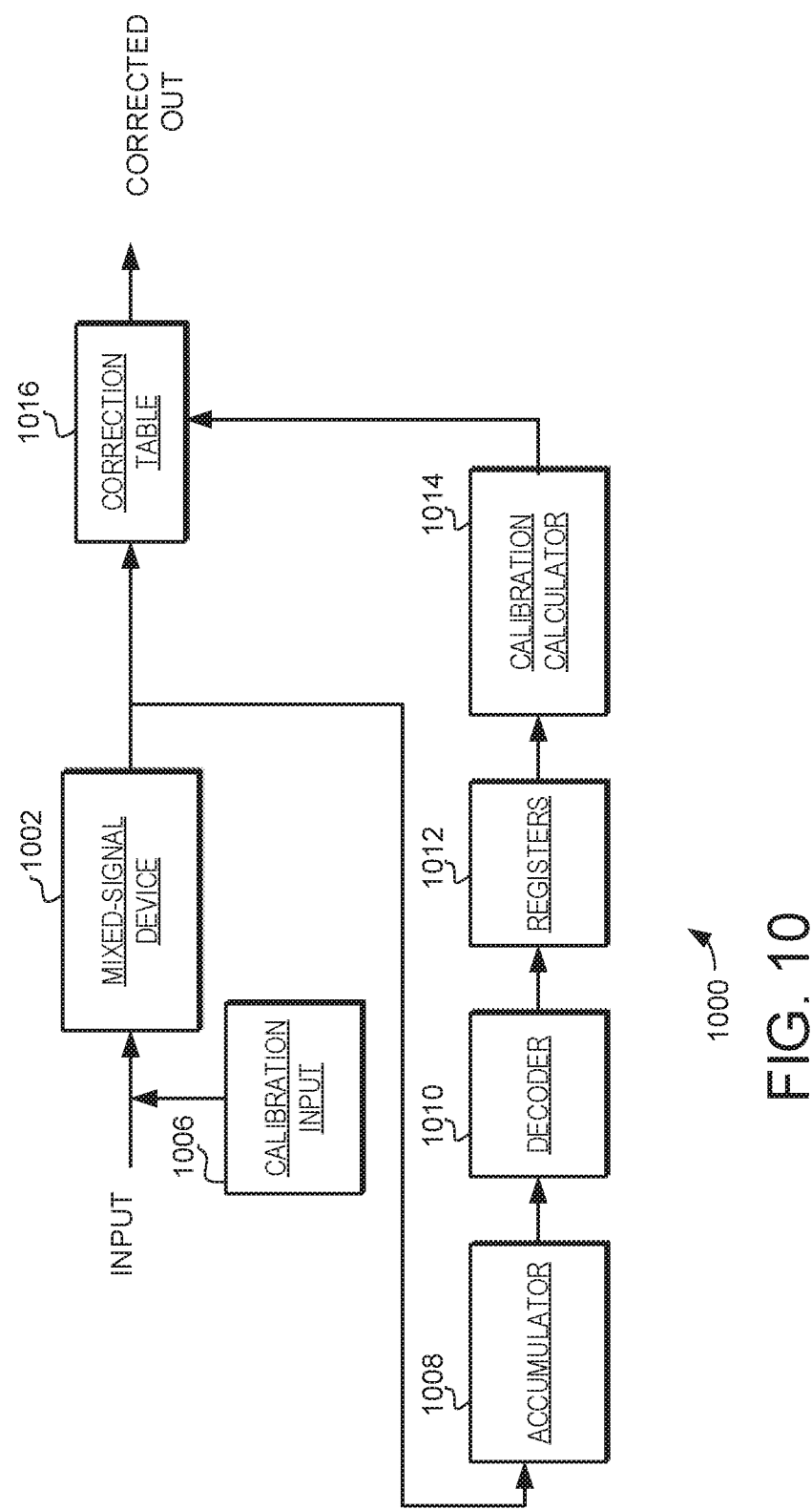
FIG. 10 is a schematic diagram of calibration system in accordance with an embodiment.

Turning now to FIG. 10, a detailed example of a calibration system 1000 is illustrated schematically. Calibration system 1000 is an example of the type of calibration system that can be implemented to use the calibration techniques described above with reference to FIGS. 2-9. The calibration system 1000 is configured to calibrate the mixed-device 1002. The calibration system 1000 includes a calibration input 1006, an accumulator 1008, a decoder 1010, registers 1012, calibration calculator 1014 and correction table 1016.

In general, calibration system 1000 generates correction values that are stored in the correction table 1016, and those correction values are then used to calibrate the output of the mixed-signal device 1002.

Specifically, a set of calibration input values can be inputted to the mixed-signal device 1002, and corresponding set of uncorrected output values can be measured from the output of the mixed-signal device 1002. The set of input values and corresponding uncorrected output values can then be used to generate corrected values using the techniques described above with reference to FIGS. 2-9. Those corrected values can then be used to populate the correction table 1016.

The calibration input 1006, accumulator 1008, decoder 1010, registers 1012, calibration calculator 1014 and correction table 1016 are implemented to perform the calibration. Specifically, the calibration input 1006 is configured to generate the sets of input values that are inputted to the mixed-signal device 1002. The calibration input 1006 can be configured to generate those sets of input values with any suitable configuration. However, as was noted above, having a greater number of input values and closer spacing between input values will result in a greater number of corresponding output values and can also result in greater accuracy of the calibration. And in most embodiments the sets of input values would be generated to have substantially equal spacing between input values, as such equal spacing facilitates the determination of localized polynomial interpolants from the corresponding output values.

The accumulator 1008 is coupled to the replica mixed-signal device 1002 output and is configured to receive the sets of generated uncorrected output values. In general, the accumulator 1008 is configured to receive multiple sets of uncorrected output values and to average the corresponding values in those multiple sets of output values. Receiving multiple sets of output values and averaging the corresponding values in those sets results in output values that are more likely to accurately represent the nonlinearities of the mixed-signal device 1002 and thus will result in more accurate calibration.

Each output value in the sets of averaged output values can then selected by the decoder 1010 and stored in a corresponding register in registers 1012. It should be noted that in a typical embodiment the decoder 1010 is an L-output decoder, where L is the number of output values in each set. Likewise, there are L registers in 1012, configured to store the L output values.

With uncorrected output values stored in the registers 1012, the calibration calculator 1014 can generate corrected output values using the techniques described above. Specifically, the uncorrected output values stored in registers 1012 are used by the calibration calculator 1014 to determine localized polynomial interpolants. Each of the determined localized polynomial interpolants is then evaluated at an uncorrected output value, and the evaluated localized polynomial interpolants are then used by the calibration calculator 1014 to generate corrected output values. Because the localized polynomial interpolants represent the corrected output as a function of the uncorrected output, the calibration calculator 1014 can evaluate the interpolants to determine the corrected output values. Again, evaluating such an interpolant can require significantly less computing resources than solving an equivalent interpolant.

With the corrected output values generated, the calibration calculator 1014 can generate the correction table 1016, where the correction table facilitates correction of the output of the mixed-signal device 1002. As one example, the correction table 1016 can be implemented as a look up table (LUT), where the uncorrected output values serve as addresses to select a more accurate corrected output values which are then substituted for the uncorrected output values. For example, the uncorrected output values can be implemented as a 5-bit LUT addresses that selects one of 32 registers, where each register contains a more accurate corrected output value that will serve as the actual output of the mixed-signal device 1002.

To perform these operations the calibration calculator 1014 and other elements can be implemented with any suitable combination of processing devices, including processors, processing units, or microprocessors. Furthermore, such processing devices can be implemented as an integrated circuit with the mixed-signal device 1002, or separate from the mixed-signal device 1002.

In one embodiment, a method of calibrating a mixed-signal device is provided, the method comprising: applying a set of input values to the mixed-signal device and measuring a corresponding set of output values from the mixed-signal device; selecting a plurality of localized sets of the output values; determining a localized polynomial interpolant for each of the plurality of localized sets of output values; evaluating each of the localized polynomial interpolants at a corresponding uncorrected output value; and generating a plurality of corrected output values from each evaluated localized polynomial interpolants.

In another embodiment, a calibration system for a mixed-signal device is provided, where the mixed-signal device inputs an analog signal and outputs a digital signal, the calibration system comprising: an output configured to generate a set of input values for the mixed-signal device; an input configured to receive a corresponding set of output values from the mixed-signal device; a calibration calculator configured to: select a plurality of localized sets of the output values; determine a localized polynomial interpolant for each of the plurality of localized sets of output values; evaluate each of the localized polynomial interpolants at a corresponding uncorrected output value; and generate a plurality of corrected output values from each evaluated localized polynomial interpolants.

In another embodiment, a calibration system for a mixed-signal device is provided, where the mixed-signal device inputs an analog signal and outputs a digital signal, the calibration system comprising: a calibration signal device configured to generate a set of input values for the mixed-signal device, where the set of input values have equal spacing between input values; an accumulator/decoder configured to receive a corresponding set of output values from the mixed-signal device; a calibration calculator configured to: receive the set of output values from the mixed signal device; select a plurality of localized sets of the output values, each of the plurality of localized sets of output values comprising at least four output values, and wherein each of the plurality of localized sets of output values overlaps with at least one adjacent localized set of output values; determine a localized polynomial interpolant for each of the plurality of localized sets of output values by generating a Lagrange basis function for each of the plurality of localized sets of output values; evaluate each of the localized polynomial interpolants at a corresponding uncorrected output value; and generate a plurality of corrected output values from each evaluated localized polynomial interpolants; and a correction table populated with the plurality of corrected output values and a plurality of uncorrected output values, the correction table configured to replace the uncorrected output values with the corresponding corrected output values to provide calibration to the mixed-signal device.

For the sake of brevity, conventional techniques related to signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the foregoing description for the purpose of reference only, and thus are not intended to be limiting.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method of calibrating a mixed-signal device, the method comprising:
    applying a set of input values to the mixed-signal device and measuring a corresponding set of output values from the mixed-signal device;
    selecting a plurality of localized sets of the output values;
    determining a localized polynomial interpolant for each of the plurality of localized sets of output values;
    evaluating each of the localized polynomial interpolants at a corresponding uncorrected output value; and
    generating a plurality of corrected output values from each evaluated localized polynomial interpolants.

2. The method of claim 1 wherein the step of determining a localized polynomial interpolant for each of the plurality of localized sets of output values comprises generating a set of basis functions for each of the plurality of localized sets of output values.

3. The method of claim 2 wherein the set of basis functions for each of the plurality of localized sets of output values comprises a set of Lagrange basis functions.

4. The method of claim 1 wherein each of the localized polynomial interpolants comprises a cubic function.

5. The method of claim 1 wherein each of the plurality of localized sets of output values overlaps with at least one adjacent localized set of output values.

6. The method of claim 1 wherein each of the plurality of localized sets of output values includes four output values.

7. The method of claim 1 further comprising the step of populating a correction table with the plurality of corrected output values and a plurality of uncorrected output values.

8. The method of claim 1 wherein the plurality of input values have equal spacing.

9. The method of claim 1 wherein the mixed-signal device comprises an analog-to-digital converter.

10. A calibration system for a mixed-signal device, where the mixed-signal device inputs an analog signal and outputs a digital signal, the calibration system comprising:
    an output configured to generate a set of input values for the mixed-signal device;
    an input configured to receive a corresponding set of output values from the mixed-signal device;
    a calibration calculator configured to:
        select a plurality of localized sets of the output values;
        determine a localized polynomial interpolant for each of the plurality of localized sets of output values;
        evaluate each of the localized polynomial interpolants at a corresponding uncorrected output value; and
        generate a plurality of corrected output values from each evaluated localized polynomial interpolants.

11. The calibration system of claim 10 wherein the calibration calculator is configured to determine a localized polynomial interpolant for each of the plurality of localized sets of output values by calculating a basis function for each of the plurality of localized sets of output values.

12. The calibration system of claim 11 wherein the basis function for each of the plurality of localized sets of output values comprises a Lagrange basis function.

13. The calibration system of claim 10 wherein each of the localized polynomial interpolants comprises a cubic function.

14. The calibration system of claim 10 wherein each of the plurality of localized sets of output values overlaps with at least one adjacent localized set of output values.

15. The calibration system of claim 10 wherein each of the plurality of localized sets of output values includes four output values.

16. The calibration system of claim 10 wherein the calibration calculator is further configured to populate a correction table with the plurality of corrected output values and a plurality of uncorrected output values.

17. The calibration system of claim 10 wherein the plurality of input values have equal spacing.

18. The calibration system of claim 10 wherein the mixed-signal device comprises an analog-to-digital converter.

19. A calibration system for a mixed-signal device, where the mixed-signal device inputs an analog signal and outputs a digital signal, the calibration system comprising:
    a calibration signal device configured to generate a set of input values for the mixed-signal device, where the set of input values have equal spacing between input values;
    an accumulator/decoder configured to receive a corresponding set of output values from the mixed-signal device;
    a calibration calculator configured to:
        receive the set of output values from the mixed signal device;
        select a plurality of localized sets of the output values, each of the plurality of localized sets of output values comprising at least four output values, and wherein each of the plurality of localized sets of output values overlaps with at least one adjacent localized set of output values;
        determine a localized polynomial interpolant for each of the plurality of localized sets of output values by generating a Lagrange basis function for each of the plurality of localized sets of output values;
        evaluate each of the localized polynomial interpolants at a corresponding uncorrected output value; and
        generate a plurality of corrected output values from each evaluated localized polynomial interpolants; and
    a correction table populated with the plurality of corrected output values and a plurality of uncorrected output values, the correction table configured to replace the uncorrected output values with the corresponding corrected output values to provide calibration to the mixed-signal device.

* * * * *